United States Patent
Miller et al.

(10) Patent No.: US 6,791,177 B1
(45) Date of Patent: Sep. 14, 2004

(54) INTEGRATED CIRCUIT PACKAGING THAT USES GUARD CONDUCTORS TO ISOLATE NOISE-SENSITIVE SIGNALS WITHIN THE PACKAGE SUBSTRATE

(75) Inventors: Leah M. Miller, Fremont, CA (US); Aritharan Thurairajaratnam, San Jose, CA (US); Edwin M. Fulcher, Palo Alto, CA (US)

(73) Assignee: LSI Logic Corporation, Milpitas, CA (US)

( * ) Notice: Subject to any disclaimer, the term of this patent is extended or adjusted under 35 U.S.C. 154(b) by 115 days.

(21) Appl. No.: 10/435,805

(22) Filed: May 12, 2003

(51) Int. Cl.[7] .............................................. H01L 23/52
(52) U.S. Cl. ...................................... 257/691; 257/698
(58) Field of Search ............................... 257/691, 698, 257/750, 758, 207, 208

(56) References Cited

U.S. PATENT DOCUMENTS

| | | | | |
|---|---|---|---|---|
| 4,091,430 A | * | 5/1978 | Berard | 361/43 |
| 4,288,694 A | * | 9/1981 | Ahrons | 250/374 |
| 4,631,412 A | * | 12/1986 | Turlej | 250/381 |
| 5,219,771 A | * | 6/1993 | Miyake | 438/151 |
| 6,184,702 B1 | | 2/2001 | Takahashi et al. | |
| 6,339,256 B2 | * | 1/2002 | Akram | 257/691 |
| 6,657,307 B2 | * | 12/2003 | Iwamoto | 257/773 |

* cited by examiner

Primary Examiner—S. V. Clark
(74) Attorney, Agent, or Firm—Conley Rose, P.C.

(57) ABSTRACT

A package substrate is contemplated herein for reducing cross-talk for noise-sensitive signals. The package substrate includes noise-sensitive conductors adapted to receive the noise-sensitive signals. In one embodiment, the cross-sectional width of the noise-sensitive conductors is increased to reduce certain parasitic effects such as resistance and/or inductance. The package substrate also includes guard conductors which are arranged co-planar with and substantially parallel to the noise-sensitive conductors. A plurality of vias spaced equidistant from one another extends from a ground conductor to the guard conductors, providing a substantially uniform voltage across the guard conductors. The overall effect will reduce the inductive and capacitive cross-talk from neighboring signals and increase the signal integrity of noise-sensitive signals.

19 Claims, 4 Drawing Sheets

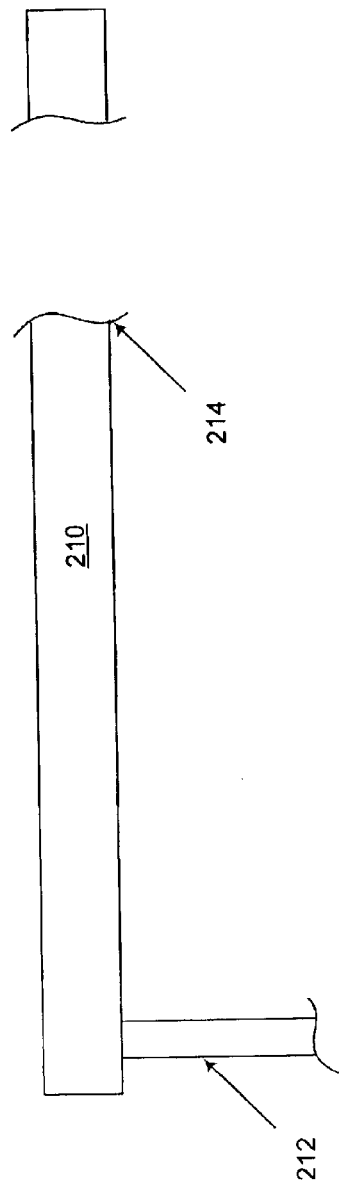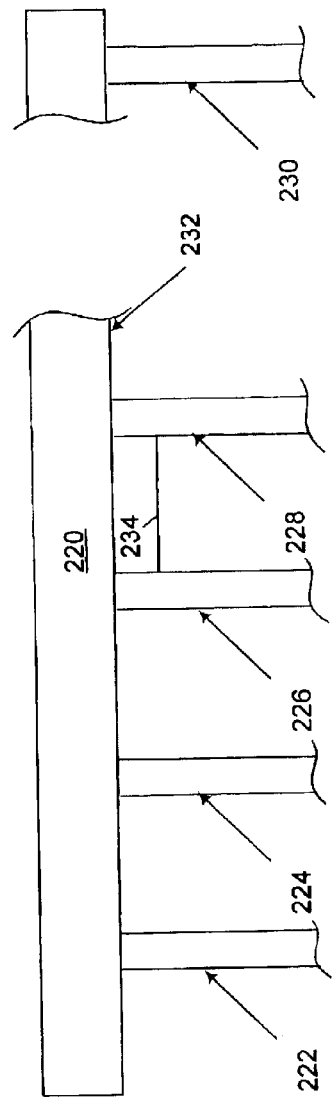

INTEGRATED CIRCUIT PACKAGING THAT USES GUARD CONDUCTORS TO ISOLATE NOISE-SENSITIVE SIGNALS WITHIN THE PACKAGE SUBSTRATE

BACKGROUND OF THE INVENTION

1. Field of Invention

This invention relates to integrated circuit packaging and, more particularly, to a substrate of the integrated circuit package (hereinafter "package substrate") that uses guard conductors that at least partially surround a conductor that is co-planar with the guard conductors, such that when the conductor receives noise sensitive signals those signals are protected against cross-talk from extraneous conductors.

2. Description of Related Art

The following descriptions and examples are not admitted to be prior art by virtue of their inclusion within this section.

Integrated circuits have evolved over the years. In part, the enhancement in semiconductor components (e.g., smaller and faster transistors) has contributed to the increased functionality and speed of integrated circuits. Modern integrated circuits have become denser in overall circuit components and employ smaller critical dimensions. Manufacturing of these modem integrated circuits has also advanced in order to maintain pace with the growing number of components involved for each integrated circuit. Fabrication processes have minimized feature sizes and thus, increased the number of die per wafer. The results provide an increase in the yield of the wafer, which lends itself to cost-efficient integrated circuits.

Following the manufacturing process, the integrated circuit may typically be secured within a protective semiconductor device package. There are various ways to secure an integrated circuit within a package. One way is to bond the integrated circuit to a leadframe and connect pads of the integrated circuits to leads of the leadframe. After packaging the integrated circuit so that leads extend from the finished package, the leads can be inserted into or surface mounted onto a printed circuit board using, for example, through-hole or surface mount techniques. Surface mount techniques include tape automated bonding.

Another way of packaging an integrated circuit is to simply flip the integrated circuit and bond the bonding pads to an array of receptors on a package substrate. In one example, a package substrate for a flip-chip application is a ball grid array ("BGA") substrate. A BGA package substrate may be made of, for example, fiberglass-epoxy printed circuit board material or a ceramic material (e.g., aluminum oxide, alumina, $Al_2O_3$, or aluminum nitride, AlN), and it may be a single layer or a multi-layer fabricated substrate. The package substrate may include a layer in which a patterned conductive material forms an electrical conductor (e.g., a power conductor plane, a ground conductor plane, etc.). In some instances, the package substrate may also include routing layers directing input and output signals through the substrate. To attach the integrated circuit, the topside of the integrated circuit is thus flipped over on top of the package substrate and typically secured using a solder reflow technique. The package substrate and the flipped integrated circuit can then be encapsulated to form the overall package. In order to route the signals between the integrated circuit and the package substrate, a plurality of vias are included to provide a connection path.

As integrated circuits become more dense and complex, there is a concern with preserving signal integrity of signals routed through the substrate and the overall noise of a package. Cross-talk can occur when mutual inductance and coupling capacitance occurs between two signals routed in close proximity to each other. Cross-talk noise can cause significant signal integrity problems in system applications.

While it is sometimes unavoidable to prevent undue cross-talk between conductors that extends across an integrated circuit substrate, it is conceivable that cross-talk can be substantially eliminated within a package substrate. An integrated circuit substrate is that across which conductors of an integrated circuit are formed. Distinguishable from an integrated circuit substrate is the package substrate. A package substrate may contain multiple layers of conductors, some of which may be dedicated to power, ground, or signal conductors, but all of which are contained within the package substrate. The integrated circuit substrate generally comprises silicon crystal silicon and resident on the substrate arc multiple layers that form a wafer. The wafer is diced into separate die that are then placed, in flip chip fashion, for example, onto the package substrate. The package substrate therefore provides an interface between the integrated circuit and the printed circuit board (PCB).

When an integrated circuit is to be bonded to a package substrate, the integrated circuit can be bonded in a flip-chip arrangement, with the integrated circuit inverted and coupled to the package substrate. The trace conductors extending across the surface of the integrated circuit are generally densely packed. Yet, when those conductors of an integrated circuit are coupled to conductors within multiple layers of the package substrate, conductors within the package substrate can undergo considerable "fanout." This means that the conductors within the package substrate can be spaced further from each other than the more densely packed conductors on the integrated circuit substrate. There may be numerous mechanisms in which to isolate noise within conductors on an integrated circuit; however, a conventional technique used to isolate noise among conductors of a package substrate is to simply space the conductors further from each other using the conventional fanout technique. However, fanout will not be sufficient in all circumstances, and certainly will not be adequate if one or more signals are especially sensitive to noise. In most instances, the trace conductors in the package substrate are much longer than trace conductors in the integrated circuit. While fanout provides help in spreading out the rather long signal trace conductors, the added length needed to effectuate fanout (as well as the large input/output count and body size of the package substrate) can increase the cross-talk noise within the package.

It would be desirable to introduce a packaging substrate that can more effectively reduce noise cross-talk among signals of adjacent conductors. The desired package substrate should be one that uses a more elaborate isolation mechanism than simply spacing the conductors further apart, and thus unduly consuming valuable substrate area. While noise induced in two signals of closely spaced conductors upon a die, or integrated circuit, is problematic, remedies against inducing additional noise among conductors within a package substrate must be sought. The desired improvement is thereby one that is focused on noise reduction in the package substrate, and not necessarily that of the integrated circuit substrate.

SUMMARY OF THE INVENTION

The problems outlined above may be in large part addressed by a multi-layer package substrate that dedicates guard conductors to minimize noise from being coupled onto conductors containing noise-sensitive signals, hereinafter referred to as noise-sensitive conductors. The package substrate may include a plurality of layers, in which one layer, preferably a surface of the package substrate may contain a plurality of terminals. The terminals can be used to couple with the integrated circuit on one surface of the package substrate or with a PCB on the opposite surface of the package substrate. The terminals that couple to the integrated circuit are often referred to as solder bumps, and the terminals that couple to the PCB are often referred to as solder balls. The terminals therefore provide input/output signals that are sent between the integrated circuit (or circuits) placed on one surface of the package substrate and the PCB on the opposing surface. One terminal can receive a ground voltage supply (or power supply) that is then routed to the layer containing a ground conductor (or power supply conductor).

In addition to the co-planar terminals placed on opposing surface of the package substrate, the package substrate can also include a plane spaced vertically between the opposing surfaces. The plane is dielectrically spaced (except for vias) from the surfaces on which the terminals reside, and can accommodate a plurality of co-planar trace conductors. This layer of co-planar trace conductors can be referred to as a routing layer, and the co-planar trace conductors can be referred to as routing conductors. A subset of the routing conductors can receive one end of a via, and the other end of the via can extend upward or downward, through a dielectric, to the layer containing the ground terminal, for example.

Spaced from the routing layer is a first and second ground conductor plane. The first ground conductor plane may extend in a contiguous member across the substrate. In some instances, however, the ground conductor plane may be made up of a plurality of ground conductors arranged co-planar across a substrate. The first ground conductor plane may extend dielectrically spaced and parallel to the second ground conductor plane. In some embodiments, the second ground conductor plane may exist in a layer underneath the layer comprising the first ground conductor plane. However, it is understood that second ground conductor plane may exist in a layer above the layer comprising first ground conductor plane. This configuration may allow for a ground voltage supply to be provided to the routing layer, whereby the routing layer is preferably between the first and second ground conductor planes. The routing layer may be extended across the substrate parallel to and dielectrically spaced from the first and second ground conductor planes.

In order to provide an electrical connection, a first via can be arranged perpendicular to the first ground conductor plane. The first via may extend from the first ground conductor to the second ground conductor, with a portion of a conductor within the routing layer coupled in the interim. The interim conductor can be referred to as a guard conductor, with first vias periodically tapping the guard conductor as the guard conductor extends along the routing layer. This may allow the conductor to be referenced to the same reference structure (e.g., first and/or second ground conductor planes) and thus, minimize the voltage variation on the guard conductor. The guard conductor can be used to electrically isolate one or more noise-sensitive conductors placed between pairs of guard conductors. The noise-sensitive conductors and the guard conductors are co-planar to each other, yet spaced from each other across the routing layer. The guard conductor provides electrical isolation to the noise-sensitive conductors by being dielectrically spaced and substantially parallel to the noise-sensitive conductors with no intervening conductors there between. Due to the minimized voltage variation on the ground conductor, the noise-sensitive signals may not be affected by a voltage transition of a neighboring signal, and thus the signal integrity of the noise-sensitive signals is preserved.

In some embodiments, the noise-sensitive signals within the noise-sensitive conductors are those derived from or can be feed to, e.g., clocked circuitry, voltage reference circuitry, etc. Noise-sensitive conductors may also comprise a pair of spaced conductors, such as conductors that receive differential clock signals or differential voltage pairs sent to or from the integrated circuit. Noise-sensitive conductors can also include conductors designed to carry the power supply or ground supply voltages to and from the integrated circuit. The cross-sectional width of a noise-sensitive signal may be increased. The increased width helps minimize the parasitic resistance and inductance.

It is recognized that the package substrate is altogether different from the integrated circuit substrate. The package substrate is, therefore, referred to as the integrated circuit package substrate, which includes a first layer, a second layer, and a third layer. The first layer can include a contiguous planar element that extends across the entire first layer or alternatively, only portion of the first layer is occupied; that portion being a first ground conductor. The second layer can include a second ground conductor. Preferably, the first ground conductor and the second ground conductor extend along the same axis, co-linear with one another, yet spaced from one another. The third layer includes a routing layer. The third layer is dielectrically spaced between the first and second layers. Preferably, a guard conductor, and more preferably, a pair of guard conductors are placed upon the third layer. The guard conductor, or guard conductors extend parallel to each other along a third axis that is spaced from, yet extends along the same vector direction (i.e., co-linear) with the first and second axis. A plurality of first vias that are preferably spaced equi-distant from each other extend between the first ground conductor and each of the pair of guard conductors. Likewise a plurality of second vias spaced preferably equi-distant from each other extend between the second ground conductor and each of the pair of guard conductors. The spaced plurality of first and second vias extend at regular intervals along the same axis as the guard conductors, where the first vias can be directly over the second vias or interspersed between and over pairs of second vias.

According to another configuration, the integrated circuit package substrate can simply include a pair of guard conductors partially surrounding at least one signal conductor, where the pair of guard conductors arm arranged co-planar with one another and are substantially parallel to one another within the routing layer of the substrate. The signal conductor is also placed within the routing layer parallel to each of the pair of guard conductors. Preferably the signal conductor, or multiple signal conductors, is placed between the pair of guard conductors. The guard conductors can receive a ground voltage from a plurality of equal-spaced vias extending perpendicular to the plane in which the pair of guard conductors extend.

According to yet another example, a semiconductor package is defined to be a package substrate that extends outside of, and exclusive of, an integrated circuit. The package substrate can receive the integrated circuit on one surface of the package surface and a ground voltage supply on possible another surface of the package substrate. The package substrate can include a ground conductor coupled to the ground voltage supply through at least one supply via. A set of equi-spaced vias can also be used to extend from the ground conductor plane to a pair of guard conductors partially surrounding a signal conductor within a routing layer of the substrate.

BRIEF DESCRIPTION OF THE DRAWINGS

Other objects and advantages of the invention will become apparent upon reading the following detailed description and upon reference to the accompanying drawings in which:

FIG. 3A is an embodiment of a guard conductor adapted to connect to a ground voltage supply;

FIG. 3B is an embodiment of a guard conductor with a minimized voltage fluctuation.

Figure 1:
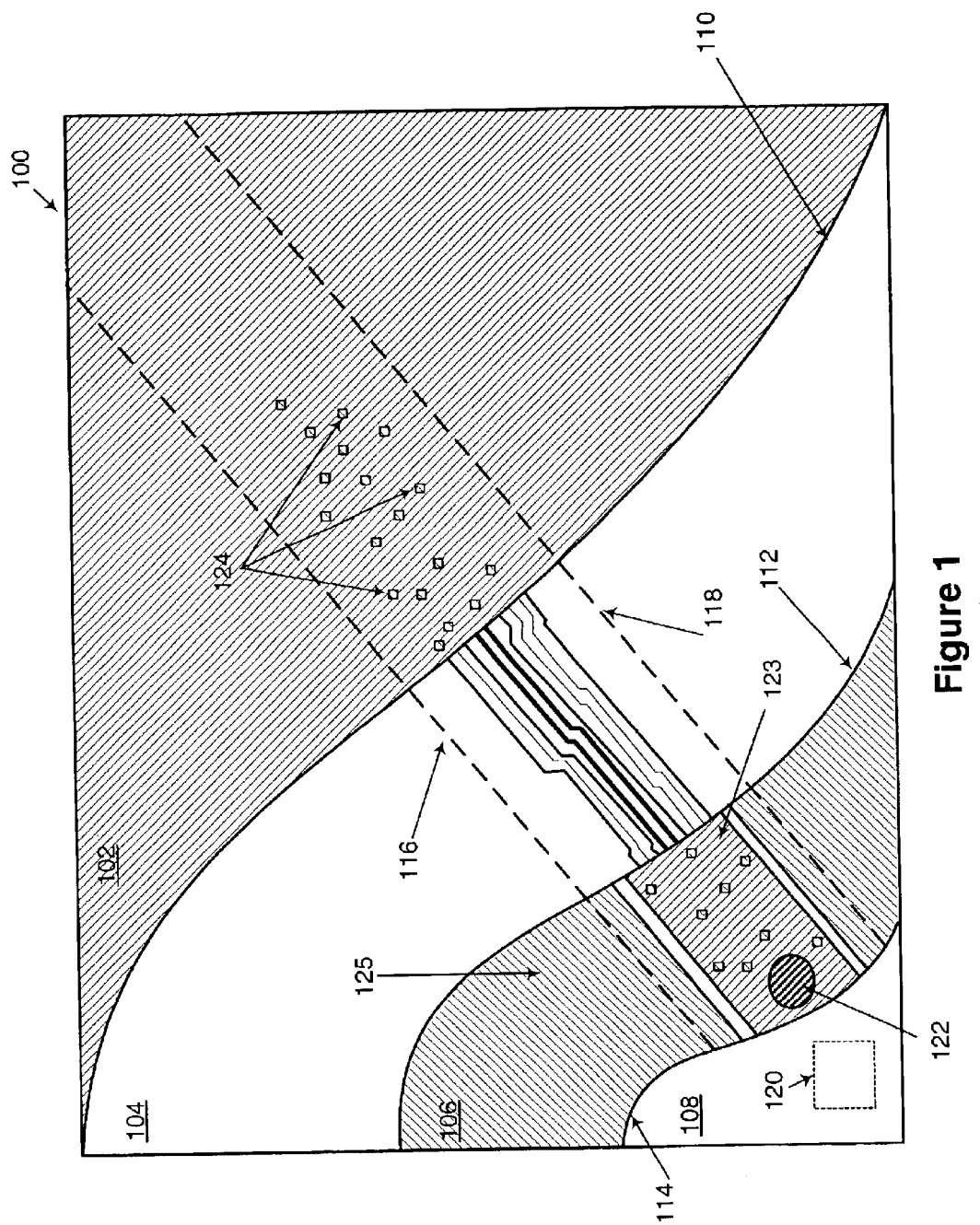
FIG. 1 is a top-view of a multi-layer substrate.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning to the drawings, FIG. 1 illustrates a top-view of a multi-layer semiconductor substrate. Substrate 100 may comprise a plurality of stacked layers (e.g., electrical conductive layer, routing layer, etc.) dielectrically spaced and parallel to one another. As illustrated in FIG. 1, substrate 100 may comprise first layer 102, second layer 104, third layer 106, and fourth layer 108. It is understood, however, that substrate 100 may comprise more layers or may comprise fewer layers, as well. At breakaway lines 110, 112, and 114, a portion of an upper layer has been removed, exposing a portion of an underlying layer: For example, at breakaway line 110, a section of first layer 102 has been removed revealing a portion of second layer 104 below.

In some embodiments, first layer 102 and third layer 106 may comprise electrical conductive planes in which first layer 102 may comprise a ground conductor and third layer 106 may comprise both a power conductor and a ground conductor. In first layer 102, for example, the ground conductor may extend as a contiguous planar element that extends across the entire first layer 102 or alternatively, only portion of first layer 102 is occupied. In third layer 106, power conductor 125 and ground conductor 123 spaced from one another and extend co-planar across a portion of third layer 106. The power and ground conductors are adapted to provide power and ground voltage supply to substrate 100.

As illustrated in FIG. 1, second layer 104 may be extended across substrate 100 between first layer 102 and third layer 106. Second layer 104 may comprise a routing layer adapted to route conductors from an integrated circuit to at least one of the multi-layers of substrate 100 and/or a plurality of input and output terminals attached to the bottom side of substrate 100. For the sake of brevity, FIG. 1 illustrates second layer 104 with a plurality of conductors between line 116 and line 118. It is understood that second layer 104 may comprise more conductors between lines 116 and 118 or may comprise fewer conductors between lines 116 and 118. In addition, second layer 104 may comprise conductors outside of lines 116 and 118 as well.

Fourth layer 108 may be an underlying layer of third layer 106, in which fourth layer 108 may be extended across substrate 100. In some embodiments, fourth layer 108 may comprise a routing layer adapted to route signals lines from the upper layers of the substrate to input/output terminal 120 (e.g., solder balls) on the bottom surface of the package substrate. For example, via 122 may be extended from third layer 106 downward to fourth layer 108 and directly connect to input/output terminal 120. It is understood, however, that fourth layer 108 may be an electrical conductor plane (e.g., a ground conductor plane) as well. In this manner, the electrical conductor plane may be directly coupled to the ground voltage supply through input/output terminal 120 as well. As such, any via extending from an upper layer (e.g., via 122) and electrically connected to fourth layer 108, will provide the upper layer with a voltage reference substantially similar to that of fourth layer 108.

Figure 2:
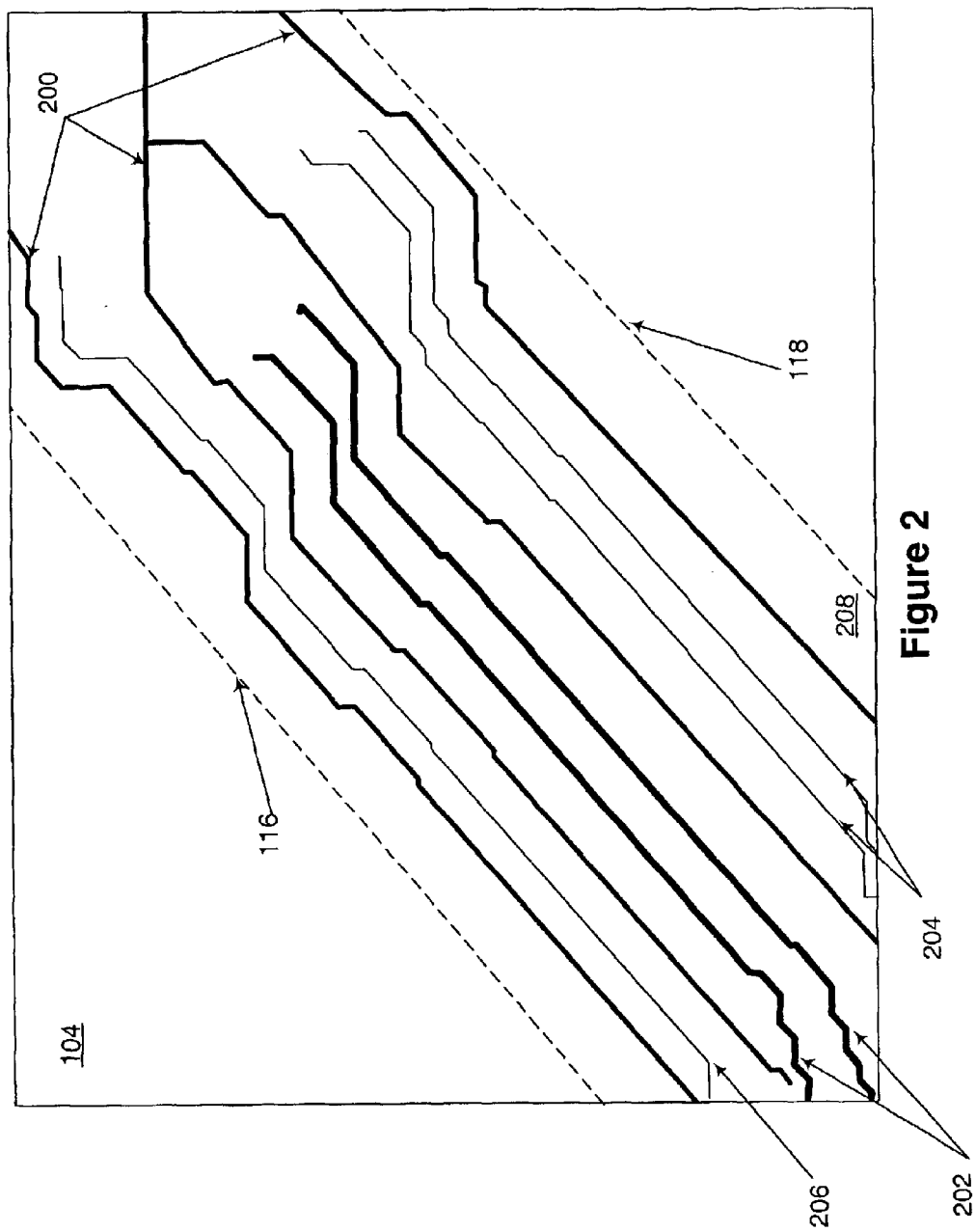
FIG. 2 is a top-view of a portion of a routing layer of the substrate.

Referring to FIG. 2, a magnified view of the area between lines 116 and 118 of second layer 104 is illustrated. Second layer 104 may be a routing layer comprising a plurality of conductors. For the sake of brevity, only a few conductors have been illustrated. It is understood that second layer 104 may comprise more conductors or may comprise a fewer number of conductors between lines 116 and 118. In some embodiments, the area between lines 116 and 118 may comprise conductors 202, 204, and 206 that carry noise-sensitive signals. Noise-sensitive conductors 202 may be a pair of phase-locked loop (PLL) conductors in which one may be adapted to receive a power supply voltage and the other may be adapted to receive a ground supply voltage. Noise sensitive conductor 204 may be a pair of differential clock or voltage signals. Noise-sensitive conductor 206 may be a reference voltage conductor. It is understood that noise sensitive conductors 202, 204, and 206 may accommodate other noise sensitive signals (e.g., a clock signal, ground reference signals, etc.) as well.

As mentioned above, cross-talk may occur when a mutual inductance and a coupling capacitance is formed between two signals closely routed (e.g., noise-sensitive signals 202 and 206). In some cases, a voltage variation on one signal may inadvertently cause a nearby signal to transition. Such a transition may cause irreversible and irrecoverable data loss, charge depletion in some circuits, a dip in a power supply voltage, or even a change in the clock frequency of a clock signal. As such, it is important to protect the signal integrity of noise-sensitive signals. In some embodiments, the width of some noise-sensitive signals may be increased. For example, FIG. 2 illustrates the enhanced width of noise-sensitive conductor 202 being greater than the surrounding conductors. Such an increase in the width reduces the overall inductance and resistance of the signal conductor.

Another method to further minimize the effects of cross-talk provides a designated location between lines 116 and 118 in which the area may be specifically used for routing noise-sensitive signals. Noise routing region 208, as illustrated in FIG. 2, may comprise noise-sensitive conductors 202, 204, and 206 as well as guard conductors 200. Within noise routing region 208, guard conductors 200 may be provided to further isolate the noise-sensitive signals such that the effects of cross-talk may be minimized. Guard conductors 200 may be routed co-planar and substantially parallel with noise-sensitive conductors 202, 204, and 206 and may be adapted to receive a ground voltage. The ground voltage applied to guard conductors may allow for minimization of the voltage fluctuation on the guard conductors. In effect, since the voltage on guard conductors 200 may be stabilized, the effects of a transition on a neighboring signal may not cause a voltage variation on the noise-sensitive signals. Thus, the routing of guard conductors 200 alongside the noise-sensitive signals will provide electrical isolation. In some embodiments, guard conductors 200 may be spaced and routed directly on both sides of a noise-sensitive signal (e.g., noise-sensitive conductor 206). Guard conductors 200 may also be spaced and routed directly on both sides of a noise-sensitive signal in which the noise-sensitive signal may be a pair of signal conductors (e.g., noise-sensitive conductor 202 or 204). It is noted that guard conductors 200 may be spaced and routed on one side of a noise-sensitive conductor as well (not shown).

However, in some embodiments, the voltage on the guard conductors may slightly fluctuate causing a probable voltage variation on the noise-sensitive signal. For example, FIG. 3A illustrates guard trace 210 connected to a ground conductor plane (not shown) through via 212. Due to the length of the guard conductors, the current flow as well as the resistance may alter the voltage on the conductor. For example, the voltage on guard conductor 210 at guard conductor point 214 may vary from the voltage applied to guard trace 210 at via 212. This voltage variance may not provide a full isolation to a noise-sensitive signal, and thus, may cause a transition in the noise-sensitive signal. To minimize this variance, FIG. 3B illustrates guard trace 220 in which a plurality of vias spaced at interval 234 may be provided. Via 222 through via 230 may be coupled to a ground voltage supply (not shown). At each interval, a substantially similar voltage is applied to the guard trace 220 such that the voltage across guard trace 220 is uniform. Thus, when routed alongside a noise-sensitive signal, guard trace 220 may isolate noise-sensitive signal from a voltage transition on neighboring signal.

As such, in order to further isolate the noise-sensitive signals routed in region 208 of FIG. 2, a plurality of vias are extended from a ground conductor plane (e.g., first layer 102) to guard conductors 200. The plurality of vias are laterally spaced such that at the spaced interval, a via may extend from the ground conductor plane to the guard conductors. For example, FIG. 1 illustrates second layer 104 is dielectrically spaced and routed underneath first layer 102. At the spaced intervals, first layer 102 may connect to a guard conductor plane (e.g., comprised in layer 102) through vias 124. In some embodiments, the spaced interval between vias 124 may be less than or equal to 1 mm. Thus, by providing a ground voltage to guard conductors 200 at smaller intervals, the voltage variation on guard conductors 200 may be reduced.

Figure 4:
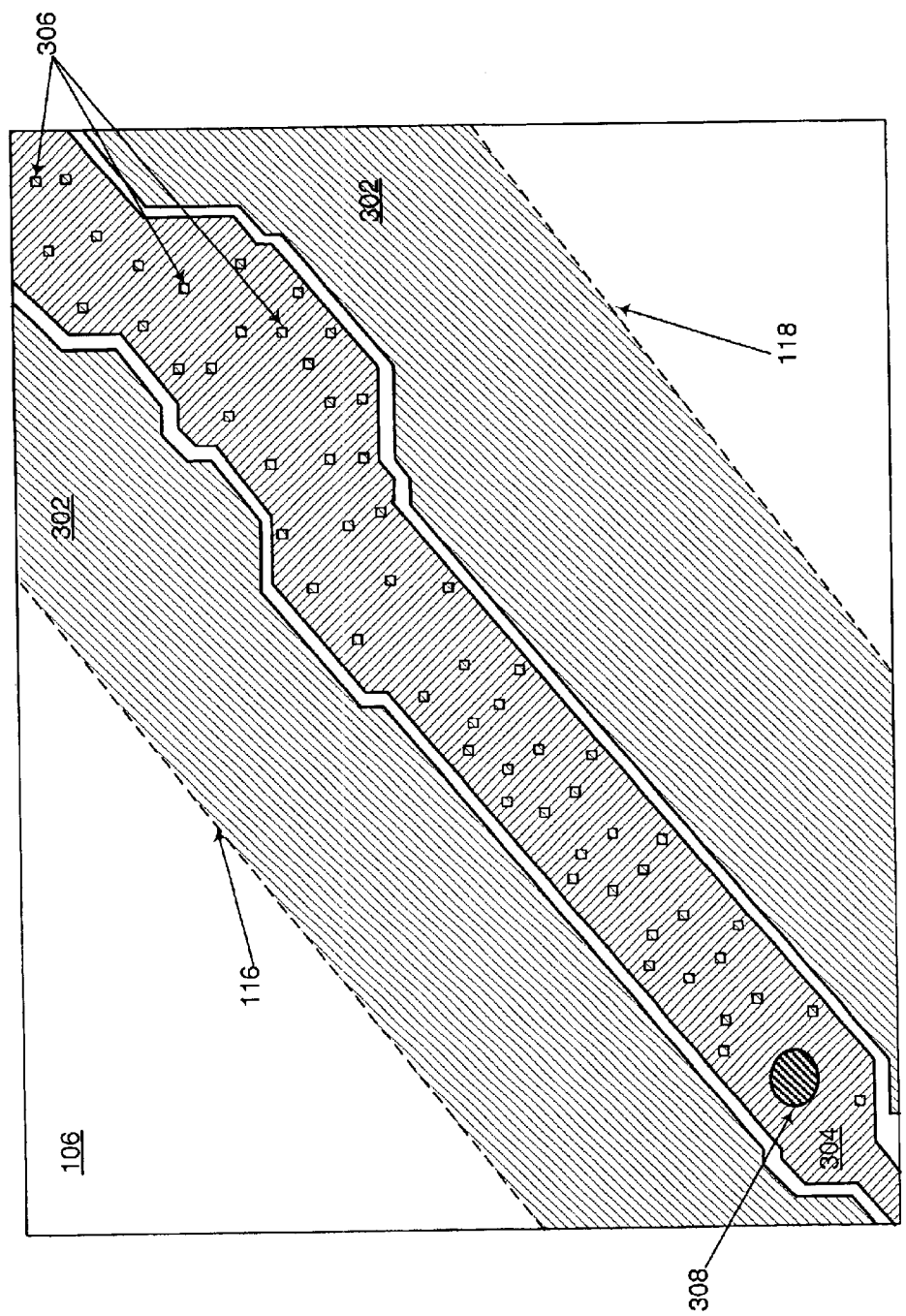
FIG. 4 is a portion of a power conductor layer of the substrate.

In some embodiments, to further isolate noise-sensitive signals, guard conductors 200 may be adapted to connect to another ground conductor plane. FIG. 4 illustrates a magnified view of third layer 106 between lines 116 and 118. Third layer 106 may be a power conductor adapted to provide a power supply voltage. In order to provide a second ground conductor for electrical isolation of noise-sensitive signals, a portion of layer 106 may include ground conductor 304. In particular, the ground conductor is dielectrically spaced and extends co-planar with power conductor 302. In order to provide a ground conductor plane, supply via 308 may be provided in which supply via 308 may be routed to underlying layers (e.g., fourth layer 108). In some embodiments, supply via 308 may connect to input/output terminal 120 (e.g., solder ball receptor, a bonding pad, etc.) located on the bottom side of substrate 100 (refer to FIG. 1). Input/output terminal 120 may provide a ground voltage supply to ground conductor plane 304 using supply via 308. However, it is understood that supply via 308 can connect to a ground conductor plane provided in the underlying layer. The ground conductor plane may be coupled to a ground voltage supply. As such, since second layer 104 may be between first layer 102 and third layer 106, guard conductors 200 may connect to the first and second ground conductor plane.

A connection exists between ground conductor plane 304 and guard conductors 200 effectuated by providing a plurality of vias. Vias 306 may be arranged on ground conductor plane 304 so that vias 306 may be vertically aligned with vias 124 of first layer 102. Alternatively, each via 306 can be vertically spaced between neighboring pairs of vias 124. Vias 306 may be spaced such that at a spaced interval, a via may be extended from ground plane conductor 304 to guard conductors 200. (In some embodiments, the space interval may at most be 1 mm.) By aligning vias 306 and vias 124 such that the vias connect to guard conductors 200 at the same point (or a slightly offset point), the ground conductor planes may have the substantially same voltage applied from a voltage source, and thus, may minimize the voltage fluctuation across the guard conductors. As such, the voltage variation on guard conductors 200 may be further reduced. The minimization may provide a stable voltage across the guard conductor, and hence may provide full, electrical isolation to noise-sensitive signals.

Referring to FIGS. 1–4, in combination, first layer 102 can include a ground conductor plane, which can either be a contiguous conductive layer or interspersed conductive trace elements. If co-planar trace elements are used, then a ground conductor can be situated between lines 116 and 118. The ground conductor within the first layer extends along an axis co-linear with the axis along which the conductors 200–206 extend within second layer 104. The grounding conductor, or contiguous metal layer within first layer 102 does not connect with all of the various signal conductors arranged on upper surface of an integrated circuit. Instead, when the integrated circuit is bonded to the upper surface of the package substrate, a passivation layer is interposed there between. Only select regions are allowed to extend through the passivation region, and thus connect to the various trace conductors on the upper surface of the integrated circuit. For example, vias 124 can extend upward beyond the ground conductor, and not simply to connect the ground conductor within first layer 102 to respective guard conductors 200, but also to connect the guard conductors, ground conductors, and ground trace conductors on the integrated circuit.

The supply via serves not only to connect with a ground conductor within third layer 106, but also to extend downward to another layer within substrate 100. For example, supply via 308 can extend to another layer which might contain another ground conductor that extends partially across the substrate, and then to another via which extends further downward to a receptor at a surface of the substrate opposite the surface in which the integrated circuit can be flip-chip bonded. Supply via 308 can therefore be used to carry a ground supply voltage to the ground conductor of the third layer 106.

Ground conductor 304 within third layer 106 is shown in FIG. 4 to extend an axis co-linear with, yet spaced from, the axis along which conductors 200–206 extend. In this fashion, the vias which are arranged in registry above guard conductors can tap periodically onto the ground conductors above as well as the ground conductors below routing layer 104. Periodically coupling to the rather large ground conductors insures little if any ground supply fluctuation exists across the guard conductors. Thus, the guard conductors insure good noise isolation of the more noise-sensitive signals placed within the noise-sensitive conductors. Those conductors are purposefully arranged between corresponding pairs of guard conductors absent any intervening conductors which would block the effects of the noise-isolation.

It will be appreciated to those skilled in the art having the benefit of this disclosure that this invention is believed to provide electrical isolation to noise-sensitive signals in a substrate. The capacitive and inductive cross-talk between noise-sensitive signals and neighboring signals are reduced, allowing preservation of signal-integrities. Further modification and alternative embodiments of various aspects of the invention will be apparent to those skilled in the art in view of this description. It is intended that the following claims be interpreted to embrace all modifications and changes and, accordingly, the specification and drawings are to be regarded in an illustrative rather than a restrictive sense.

What is claimed is:

1. An integrated circuit package substrate, comprising:
   a first layer including a first ground conductor that extends along a first axis;
   a second layer including a second ground conductor that extends along a second axis spaced from yet along the same direction as the first axis;
   a third layer dielectrically spaced between the first and second layers including a pair of guard conductors that extend parallel to each other along a third axis spaced co-linear with the first and second axes;
   a plurality of first vias spaced equidistant from each other and extending between the first ground conductor and each of the pair of guard conductors; and
   a plurality of second vias spaced from each other and extending between the second ground conductor and each of the pair of guard conductors.

2. The semiconductor substrate as recited in claim 1, wherein the third layer comprises a conductor spaced parallel to and between the pair of guard conductors.

3. The semiconductor substrate as recited in claim 1, wherein the third layer comprises a conductor interposed between the pair of guard conductors.

4. The semiconductor substrate as recited in claim 3, wherein the conductor is adapted to receive a power supply voltage or a clock signal.

5. The semiconductor substrate as recited in claim 3, wherein the conductor comprises a cross-sectional area greater than the guard conductors.

6. The semiconductor substrate as recited in claim 1, wherein the first vias are spaced approximately 1.0 mm or less depending on operating frequency of signals forwarded through the first vias.

7. The semiconductor substrate as recited in claim 1, wherein the second vias are spaced approximately 1.0 mm or less apart.

8. The semiconductor substrate as recited in claim 4, wherein the conductor and the guard conductor are spaced from each other absent any intervening conductors.

9. The semiconductor substrate as recited in claim 1, further comprising a receptor extending across an outer surface of the substrate and adapted to receive a ground supply voltage.

10. The semiconductor substrate as recited in claim 9, wherein the receptor is coupled to a supply via that extends to the first or second ground conductor.

11. An integrated circuit package substrate, comprising:
    a pair of guard conductors arranged co-planar with and substantially parallel to each other across a routing layer of the substrate;
    at least one signal conductor arranged co-planar with and substantially parallel to each of the pair of guard conductors; and
    wherein the guard conductors are adapted to receive a ground voltage from a plurality of equi-spaced vias extending perpendicular to the plane in which the pair of guard conductors extend.

12. The semiconductor package as recited in claim 11, further comprising:
    a pair of ground conductors extending in the same direction and placed within respective layers of the substrate dielectrically spaced from a layer containing the pair of guard conductors; and
    wherein the vias extend between the pair of ground conductors and the pair of guard conductors.

13. The semiconductor package as recited in claim 11, wherein the vias are spaced approximately 1.0 mm or less apart.

14. The semiconductor package as recited in claim 11, wherein at least one of the pair of ground conductors extends as a contiguous member across the entire respective layer of the substrate.

15. The semiconductor substrate as recited in claim 11, wherein the at least one signal conductor is adapted to receive a noise sensitive signal, such as a reference voltage, a clock, or a supply signal.

16. The semiconductor substrate as recited in claim 11, wherein the at least one signal conductor comprises a pair of parallel spaced conductors, one of which is adapted to receive a power supply voltage and the other is adapted to receive a ground voltage.

17. The semiconductor substrate as recited in claim 16, wherein each of the pair of conductors have a wider cross section than other conductors arranged in the routing layer of the substrate.

18. A semiconductor package, comprising:
    a package substrate outside of and apart from an integrated circuit, wherein the package substrate includes an outer surface adapted to receive the integrated circuit and an opposed outer surface adapted to receive a ground voltage supply;
    wherein the package substrate further includes:
    a ground conductor plane coupled to the ground voltage supply through a at least one supply via; and
    a set of second vias spaced from each other and extending from the ground conductor plane to a pair of guard conductors partially surrounding a signal conductor within a routing layer of the substrate.

19. The semiconductor package as recited in claim 18, wherein each of the set of second vias are spaced laterally from each other less than or equal to 1 mm apart depending on operating frequency of signals forwarded through the set of second vias.

* * * * *